United States Patent [19]
Bouwer et al.

[11] Patent Number: 5,204,712
[45] Date of Patent: Apr. 20, 1993

[54] SUPPORT DEVICE WITH A TILTABLE OBJECT TABLE, AND OPTICAL LITHOGRAPHIC DEVICE PROVIDED WITH SUCH A SUPPORT DEVICE

[75] Inventors: Adrianus G. Bouwer, Eindhoven; Marcel C. M. Baggen, Nuenen; Henricus W. A. Janssen, Eindhoven; Petrus R. Bartray, IJsselsteijn; Jan Van Eijk, Eindhoven, all of Netherlands

[73] Assignees: U.S. Philips Corp., New York, N.Y.; A.S.M. LIthography B.V., Veldhoven, Netherlands

[21] Appl. No.: 774,763

[22] Filed: Oct. 9, 1991

[30] Foreign Application Priority Data

Mar. 8, 1991 [NL] Netherlands ............ 9100421

[51] Int. Cl.$^5$ ............................................ G03B 27/42
[52] U.S. Cl. .................................... 355/53; 355/72
[58] Field of Search ......................... 355/53, 72, 77; 318/640

[56] References Cited

U.S. PATENT DOCUMENTS

| 4,431,304 | 2/1984 | Mayer | 355/53 X |
|---|---|---|---|
| 4,473,291 | 9/1984 | Mayer | 355/53 |
| 4,676,649 | 6/1987 | Phillips | 355/53 X |
| 4,698,575 | 10/1987 | Bouwer | 318/640 |
| 4,708,465 | 11/1987 | Isohata et al. | 355/53 |
| 4,737,823 | 4/1988 | Bouwer et al. | 355/53 |
| 4,746,800 | 5/1988 | Van Eijk et al. | 250/442.1 |
| 5,061,956 | 10/1991 | Takubo et al. | 355/53 X |
| 5,130,747 | 7/1992 | Kikuiri et al. | 355/53 X |

FOREIGN PATENT DOCUMENTS 0421527 4/1991 European Pat. Off. .

*Primary Examiner*—Richard A. Wintercorn
*Attorney, Agent, or Firm*—Jack D. Slobod

[57] ABSTRACT

A support device comprises a first and a second bearing unit for guiding the support device along a base surface and a straight guide extending parallel to the base surface, respectively. The support device has an object table which is coupled to a rigidification member and which is displaceable relative to the two bearing units in a z-direction transverse to the base surface and is tiltable about at least one axis of rotation directed parallel to the base surface by three force actuators. The rigidification member is coupled to the second bearing unit by a coupling member which is elastically deformable in the z-direction, and coupled to the first bearing unit via the force actuators, whereby a statically determined coupling of the rigidification member and the object table to the two bearing units is obtained. The support device is particularly suitable for displacements of an object in the sub-micron range, such as, for example, in an optical lithographic device. In particular, an accurate focusing of the object may be obtained by the use of the support device in an optical lithographic device.

33 Claims, 10 Drawing Sheets

SUPPORT DEVICE WITH A TILTABLE OBJECT TABLE, AND OPTICAL LITHOGRAPHIC DEVICE PROVIDED WITH SUCH A SUPPORT DEVICE

FIELD OF THE INVENTION

The invention relates to a support device having a first bearing unit which supports a second bearing unit for guiding the support device along a base surface and a straight guide extending parallel to the base surface, respectively, and a support unit which is provided with an object table and with a rigidification member and which is displaceable relative to the first bearing unit parallel to a z-direction, which is perpendicular to the base surface, by means of a force actuator system.

The invention also relates to an optical lithographic device provided with a support device according to the invention.

BACKGROUND OF THE INVENTION

A support device of the kind mentioned in the opening paragraph is known from U.S. Pat. No. 4,698,575. In this known support device, the force actuator system is provided with four rods acting as a parallelogram mechanism by which a rigidification member is coupled to a first bearing unit. A second bearing unit is directly fastened to the rigidification member, so that the object table is guided along a straight guide in an accurate manner. Displacements of the object table parallel to the z-direction of a few tens of micrometers are obtained by means of the force actuator system, the parallelogram mechanism preventing a tilting movement of the object table about an axis of rotation directed parallel to the base surface. The known support device is used inter alia in an optical lithographic device for the manufacture of integrated semiconductor circuits, the object table comprising a support surface for a semiconductor substrate to be illuminated. The semiconductor substrate is focused relative to a lens system of the optical lithographic device by a displacement parallel to the z-direction.

A drawback of the known support device, which becomes apparent upon the application of the support device in an optical lithographic device, is that focusing of a substrate takes place exclusively by means of a displacement of the substrate parallel to the z-direction. A substrate of non-uniform thickness is not optimally focused in this way. In addition, only comparatively small displacements of the substrate in the z-direction can be carried out by means of the known support device, because the rigidification member is directly fastened to the second bearing unit.

SUMMARY OF THE INVENTION

It is an object of the invention to provide a support device of the kind mentioned in the opening paragraph by which a batter focusing of the substrate is possible, while at the same time the object table is guided along the straight guide in an accurate manner.

The invention is for this purpose characterized in that the support unit is rotatably relative to the first and second bearing unit about at least one axis of rotation directed parallel to the base surface by means of a force actuator system, while the rigidification member is coupled to the second bearing unit by means of a coupling member which is elastically deformable in a direction parallel to the z-direction. Since the support unit is rotatable about at least one axis of rotation directed parallel to the base surface, substrates having a non-uniform thickness can be optimally focused, while the use of the elastically deformable coupling member between the rigidification member and the second bearing unit renders possible a comparatively great displacement of the support unit parallel to the z-direction.

A particular embodiment of the support device according to the invention, in which the force actuator system is formed by three force actuators, is characterized in that each of the force actuators during operation exerts a force on the rigidification member which is substantially parallel to the z-direction. The use of the force actuators provides a statically determined coupling of the rigidification member to the two bearing units, whereby a supporting force exerted by the base surface on the support device parallel to the z-direction and a torque about an axis directed parallel to the base surface are transmitted to the rigidification member via the first bearing unit and the force actuator system, while a positioning force parallel to the base surface exerted by the straight guide on the support device and a torque about an axis directed parallel to the z-direction are transmitted to the rigidification member via the second bearing unit and the elastic coupling member.

A further embodiment of the support device according to the invention, which has a particularly accurate force actuator system with low hysteresis, is characterized in that each of the force actuators is provided with a cam and a driven cam follower, the cam being fastened to a rotatable camshaft directed parallel to the base surface and the cam follower being coupled to an output shaft of a drive motor directed parallel to the camshaft. Through an optimization of the transmission ratio between the cam and the cam follower, moreover, the use of a reduction mechanism between the drive motor and the cam follower is avoided, so that a particularly simple, compact, and fast-operating force actuator system is provided.

A yet further embodiment of the support device according to the invention, which provides a practical arrangement of the drive motor and the camshaft, is characterized in that the drive motor is fastened to the first bearing unit, while the camshaft is coupled to the rigidification member.

A particular embodiment of the support device according to the invention, which has a simple, compact and effective rigidification member, is characterized in that the rigidification member comprises three support elements for supporting the object table, which elements are situated in a triangle relative to one another in a plane transverse to the z-direction, the support elements being interconnected by means of plate-shaped strips, while each of the support elements is coupled to the second bearing unit by an elastic coupling member which extends in the plane.

A further embodiment of the support device according to the invention,. which provides a particularly rigid and statically determined coupling of the rigidification member to the second bearing unit, is characterized in that each of the elastic coupling members comprises a plate-shaped strip which extends transverse to a bisector of the triangle situated adjacent the relevant support element and which is provided near both its ends with a reduced portion extending substantially parallel to the relevant bisector.

A still further embodiment of the support device according to the invention is characterized in that each of the support elements of the rigidification member comprises a support ball. The use of the support balls leads to an accurate and stress-free support of the object table.

A still further embodiment of the support device according to the invention, which provides a particularly rigid and statically determined coupling of the rigidification member to the first bearing unit, is characterized in that each of the support elements of the rigidification member is coupled to one of the force actuators of the force actuator system by an elastic rod which extends in a direction parallel to the z-direction.

A further embodiment of the support device according to the invention, in which the elastic rods are formed in an effective manner, is characterized in that each of the elastic rods comprises a column extending parallel to the z-direction and provided near both its ends with two mutually perpendicular reduced portions.

A particular embodiment of the support device according to the invention is characterized in that the rigidification member, seen in the z-direction, is positioned between the first and the second bearing unit, the object table being fastened to the rigidification member by means of elastic support columns which extend alongside the second bearing unit parallel to the z-direction, while the second bearing unit is fastened to the first bearing unit by fastening members which extend alongside the rigidification member parallel to the z-direction. Since the rigidification member is positioned between the first and the second bearing unit, the center of gravity of the support unit formed by the rigidification member and the object table lies near the second bearing unit seen in the z-direction, so that the support device is guided along the straight guide in a particularly stable manner.

A further embodiment of the support device according to the invention, which provides a particularly rigid coupling of the rigidification member to the second bearing unit, is characterized in that the rigidification member is coupled to the second bearing unit by means of three leaf springs extending transverse to the z-direction.

A further embodiment of the support device according to the invention, which provides a particularly rigid coupling of the rigidification member to the second bearing unit, is characterized in that the rigidification member is coupled to the second bearing unit by means of three leaf springs extending transverse to the z-direction.

A yet further embodiment of the support device according to the invention, which provides a particularly rigid and statically determined coupling of the object table to the rigidification member, is characterized in that the object table is fastened to the rigidification member by means of three elastic support columns which are each provided at a first and a second end with a first reduced portion extending parallel to the base surface and a second reduced portion extending parallel to the first reduced portion, respectively, and which are each provided between the first and the second reduced portions with a third reduced portion extending transverse to the first and the second reduced portion.

A still further embodiment of the support device according to the invention, which provides a practical arrangement of the drive motor and the camshaft, is characterized in that the drive motor is fastened to the rigidification member, while the camshaft is fastened to the first bearing unit.

An optical lithographic device in which the characteristics of the support device used therein become particularly apparent is characterized in that the z-direction the optical lithographic device is successively provided with the support device, a lens system with an optical main axis directed parallel to the z-direction, a manipulator for a mask, and a light source with a shutter for repetitive illumination of a substrate which is to be supported by the support device, the object table comprising a support surface for the substrate which is substantially perpendicular to the optical main axis.

It is noted the U.S. Pat. No. 4,746,800 discloses three elastically deformable rods by way of coupling between a manipulator and an object table. No controllable force actuators, however, are referred to therein.

BRIEF DESCRIPTION OF THE DRAWING

The invention is explained in more detail below with reference to the drawing, in which.

DESCRIPTION OF THE PREFERRED EMBODIMENTS

Figure 1:
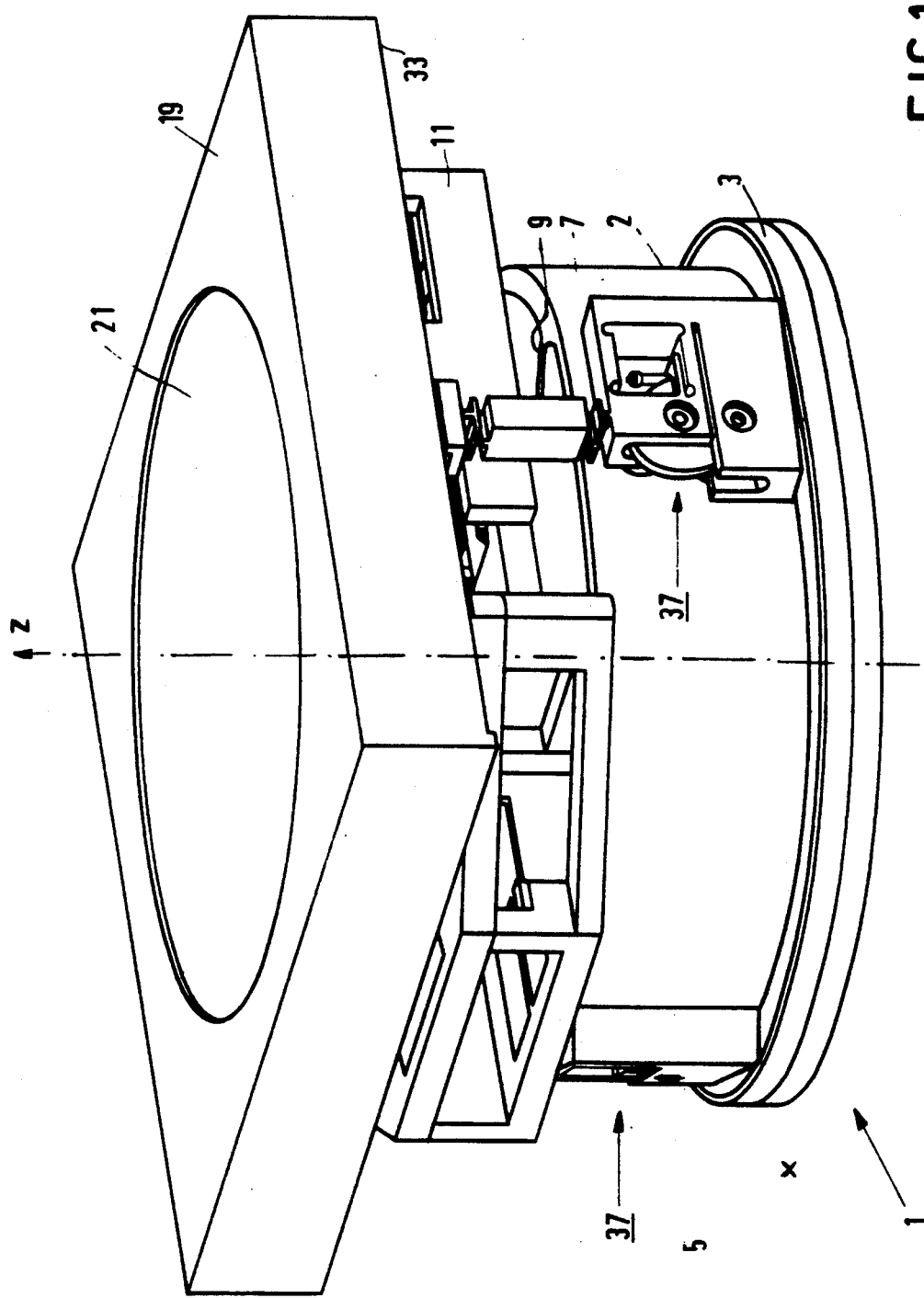
FIG. 1 shows a first embodiment of a support device according to the invention.
Figure 2:
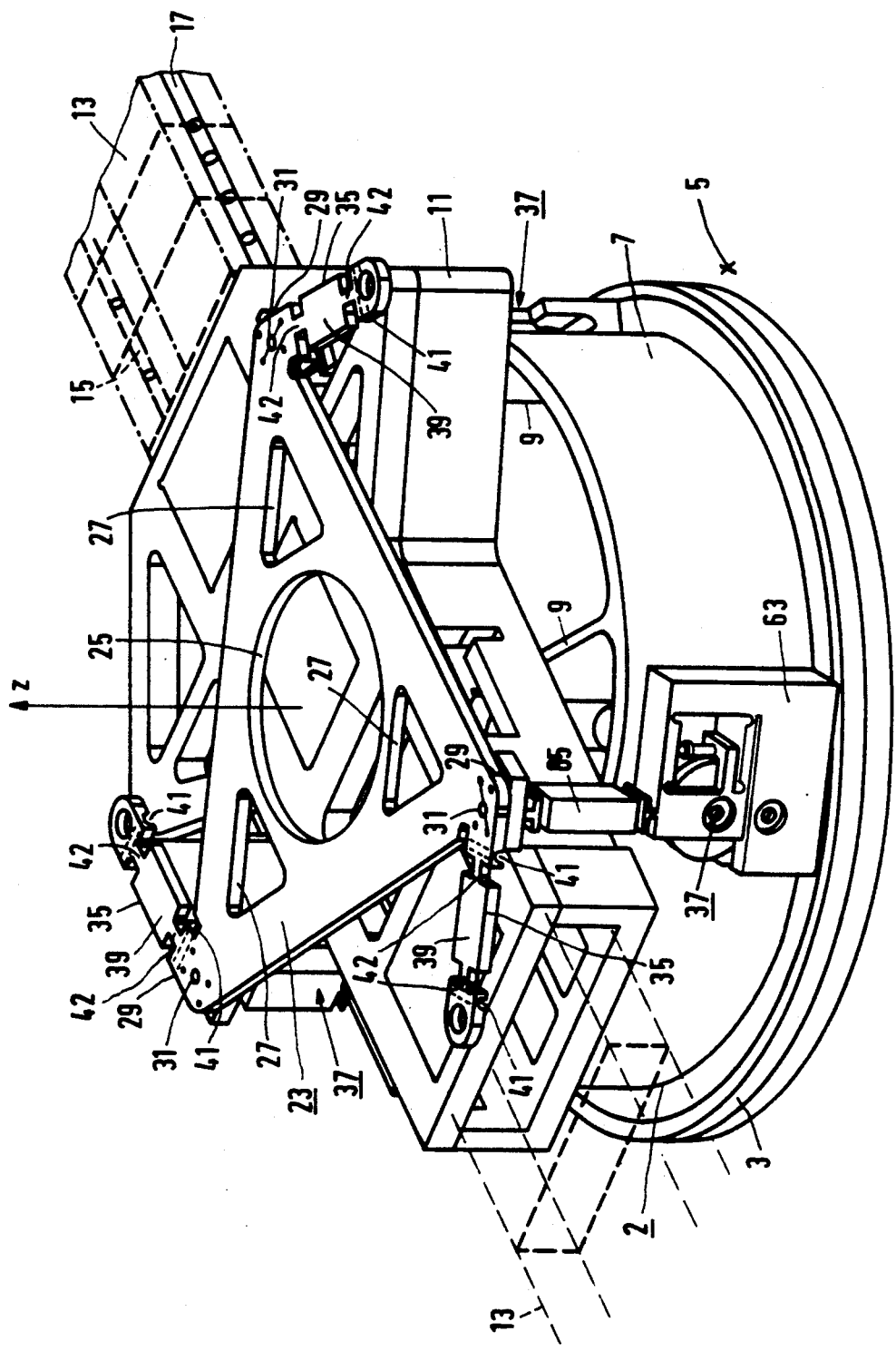
FIG. 2 shows the support device of FIG. 1, an object table of the support device being left out.

The first embodiment of the support device 1 according to the invention shown in FIGS. 1 to 4 is provided with a first bearing unit 2 which has a round so-called aerostatic foot 3. By means of the aerostatic foot 3, which is known per se from U.S. Pat. No. 4,698,575 and is provided with a static gas bearing pretensioned by means of an underpressure, the support device 1 is contactlessly guided along a base surface 5 which extends perpendicular to a z-direction indicated in FIGS. 1 and 2. As shown in FIG. 2, the first bearing unit 2 is further provided with an upright metal wall 7 extending along a circumference of the aerostatic foot 3 and with radial metal partition walls 9 which extend transverse to the upright wall 7. Only two partition walls 9 are visible in FIG. 2. The use of the upright wall 7 and the partition walls 9 leads to a particularly rigid construction of the first bearing unit 2, so that an accurate and stable guiding of the support device 1 along the base surface 5 is obtained by means of the first bearing unit 2.

The support device 1 is further provided with a second bearing unit 11 which is fastened on the first bearing unit 2. The second bearing unit 11 guides the support device 1 along a straight guide 13 which is depicted only diagrammatically in FIG. 2 and which extends parallel to the base surface 5. The straight guide 13 is provided with round, parallel rods 15 and 17, while the second bearing unit 11 is provided with roller members, not visible in FIGS. 1 and 2, for guiding the second bearing unit 11 along the rods 15 and 17. It is noted that such a guiding is known from the U.S. Pat. No. 4,698,575. It will be explained below how the second bearing unit 11 in a particularly suitable application of the support device 1 in an optical lithographic device is integrated in a drive unit of the optical lithographic device for the displacement of the support device 1 along the base surface 5 and the straight guide 13.

As is shown in FIG. 1, the support device 1 is further provided with an object table 19 comprising a support surface 21 which extends transverse to the z-direction direction and on which an object can be placed. The object table 19 is provided on a rigidification member 23 which is visible in FIG. 2, in which the object table 19 is left out. The rigidification member 23 is constructed as a substantially triangular metal plate in which recesses 25 and 27 are provided and which extends transverse to the z-direction. The rigidification member 23 is provided with a sapphire support ball 31 near each of its corners 29. The object table 19, of which a lower side 33 shown in FIG. 1 is provided with three V-shaped grooves not visible in the Figure which extend in radial directions relative to a center of the object table 19 and whose relative positions correspond to the relative positions of the support balls 31, rests on the three support balls 31 in the assembly shown in FIG. 1. The support balls 31 each exert a supporting force on the object table 19 which is directed substantially parallel to the z-direction. The use of the support balls 31 prevents a bending torque being transmitted from the rigidification member 23 to the object table 19, so that an accurate and stress-free support of the object table 19 is obtained. It will be elucidated below that such a stress-free support of the object table 19 is of particular advantage in the application of the support device 1 in an optical lithographic device.

As is shown in FIG. 2, the rigidification member 23 is coupled to the second bearing unit 11 by an elastic coupling member 35 and to the first bearing unit 2 via a force actuator 37 near each of its corners 29. Only one force actuator 37 is fully visible in FIG. 2, the two other force actuators 37 being only partly visible.

The coupling members 35 form an integral whole with the rigidification member 23 and are each formed by a plate-shaped strip 39 which is situated in a plane transverse to the z-direction and extends transverse to a bisector of the angle of the corresponding corner 29. Each of the coupling members 35 is provided near both its ends with a first circular cylinder reduced portion 41 which is formed by a recess parallel to the relevant bisector. The reduced portions 41 each form an elastic hinge with a hinge axis extending parallel to the relevant bisector. So that the ends of the coupling members 35 connected to the corners 29 of the rigidification member 23 are displaceable parallel to the z-direction. A positioning force directed parallel to the base surface 5 and exerted during operation by the straight guide 13 on the support device 1, as well as a torque derived from the positioning force about an axis extending parallel to the z-direction is directly passed on to the rigidification member 23 by the elastic coupling members 35. The coupling of the rigidification member 23 to the second bearing unit 11 has a high rigidity seen in a direction transverse to the z-direction, so that the object table 19 is guided in an accurate manner along the straight guide 13.

Each corner 29 of the rigidification member 23 is displaceable parallel to the z-direction by the force actuators 37 mentioned above. When the three force actuators 37 are driven in identical manners, the rigidification member 23 with the object table 19 is displaced parallel to the z-direction under elastic deformation of the first reduced portions 41, whereby a slight rotation of the rigidification member 23 and the object table 19 about an axis of rotation parallel to the z-direction occurs, which rotation is in itself undesirable. Undesirable mechanical stresses which can arise as a result of this rotation near the support balls 31 are prevented in that each of the elastic coupling members 35 is given a second reduced portion 42 shown in FIG. 2 and extending parallel to the z-direction near its two ends. As will be explained below, this undesirable rotation of the object table 19 can be compensated for in a simple manner in the application of the support device 1 in an optical lithographic device. The use of the coupling members 35 with the reduced portions 41 and 42 renders displacements of the object table 19 of approximately 1 mm parallel to the z-direction possible. When the three force actuators 37 are driven in different ways, not only a displacement of the object table 19 parallel to the z-direction, but also a rotation of the object table 19 about an axis of rotation parallel to the base surface 5 is obtained. The use of such a rotation in the application of the support device 1 in an optical lithographic device is explained in more detail below.

Figure 3:
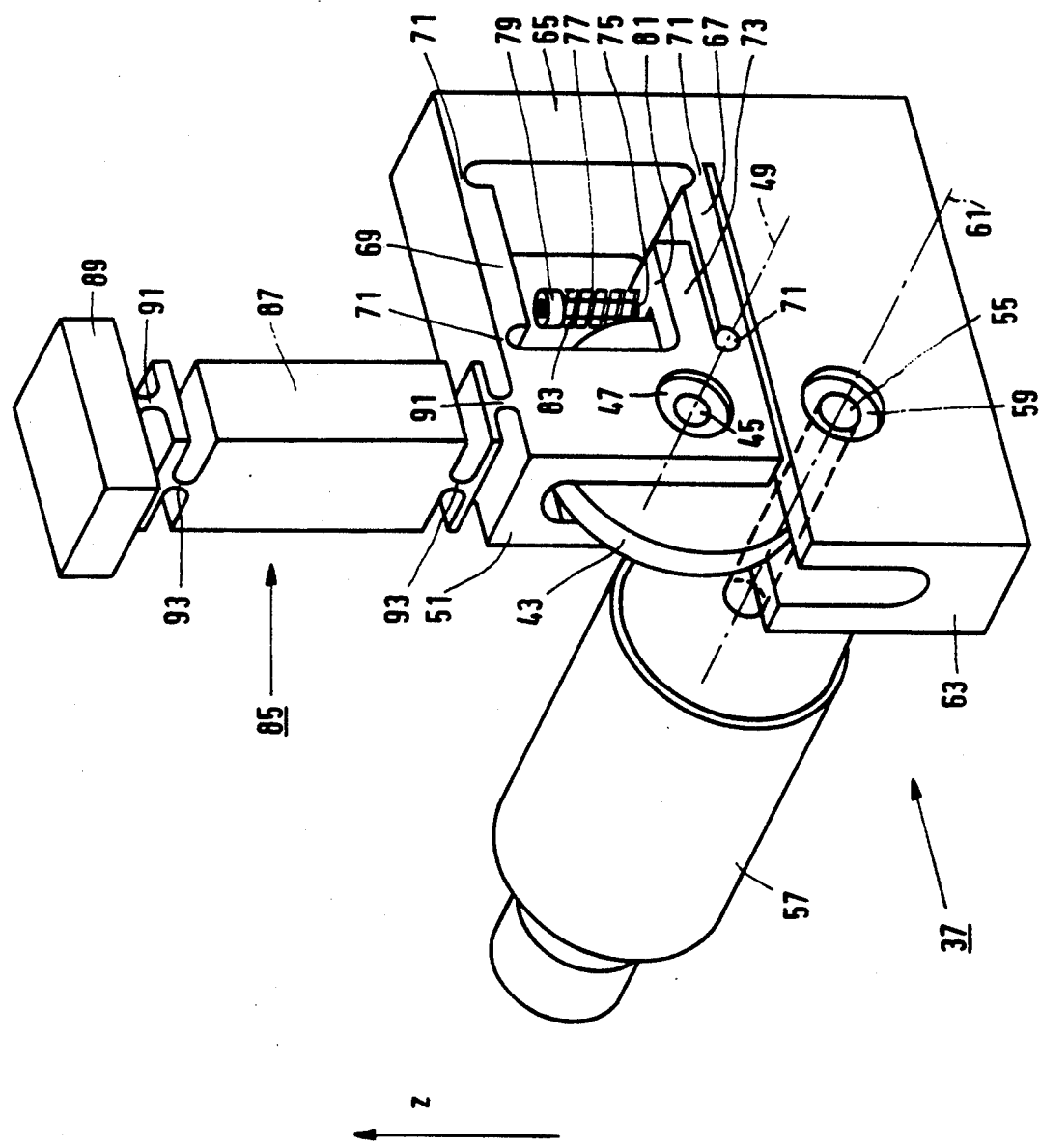
FIG. 3 shows a force actuator forming part of a force actuator system of the support device of FIG. 1.
Figure 4:
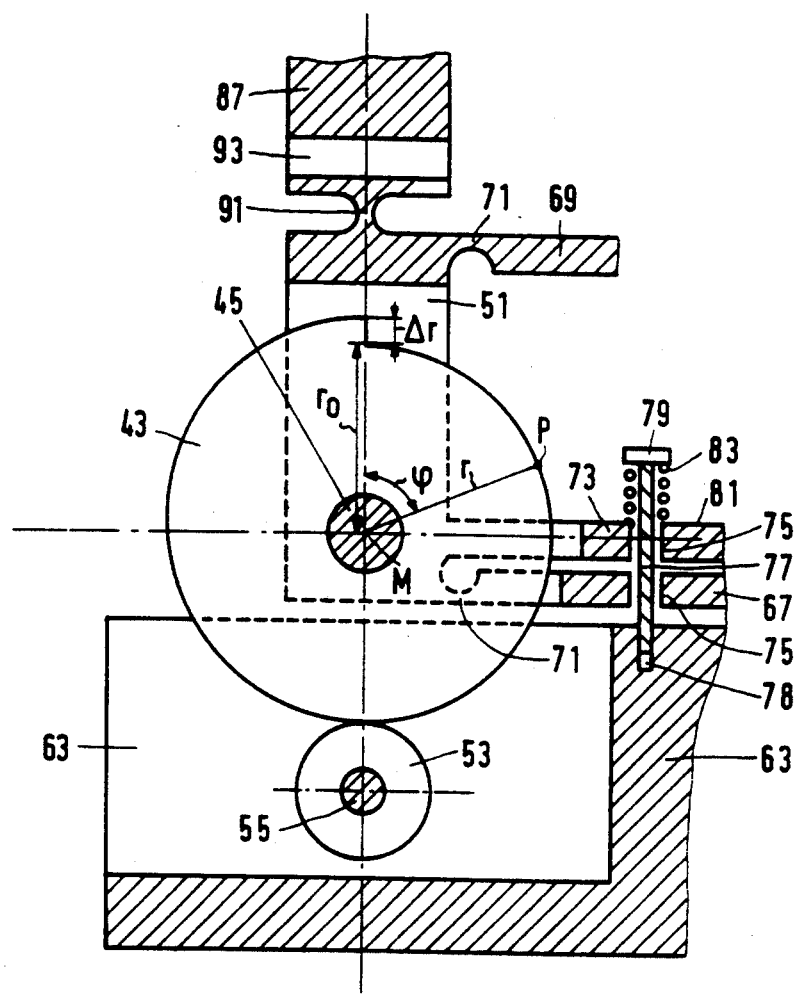
FIG. 4 is a cross-section of the force actuator of FIG. 3.

FIG. 3 shows the force actuator 37 in detail. The force actuator 37 is provided with a metal cam-shaped disc 43 which is rotatably supported in two ball bearings 47 by two journals 45. Only one journal 45 with the accompanying ball bearing 47 is visible in FIG. 3. The ball bearings 47, which have a common centerline 49 extending parallel to the base surface 5, are provided in the two legs of a first U-shaped bearing block 51 of the force actuator 37. FIG. 4 shows that at the cam-shaped disc 43 a distance 4 between a center M of the disc 43 situated on the centerline 49 and a point P on the circumference of the disc 43 is a linear function of an angle $\phi$ indicated in the Figure:

$$r = r_0 + \Delta r \cdot \phi / 2\pi$$

The value of $r_0$ is approximately 15 mm, while the value of $\Delta r$ is approximately 1 mm. As FIG. 4 shows, the force actuator 37 is further provided with a round metal cam follower 53 which bears on the cam-shaped disc 43. The cam follower 53 is provided at an end of an output shaft 55, shown in FIG. 3, of an electric motor 57 which is fastened to the first bearing unit 2. The output shaft 55 is rotatably supported in two ball bearings 59, of which only one is visible in FIG. 3. The ball bearings 59 have a common centerline 61 extending parallel to the base surface 5 and are provided in a second U-shaped bearing block 63 which, as FIG. 2 shows, is fastened to the first bearing unit 2 near the circumference of the aerostatic foot 3. The cam follower 53 has a diameter of approximately 4 mm.

Figure 5:
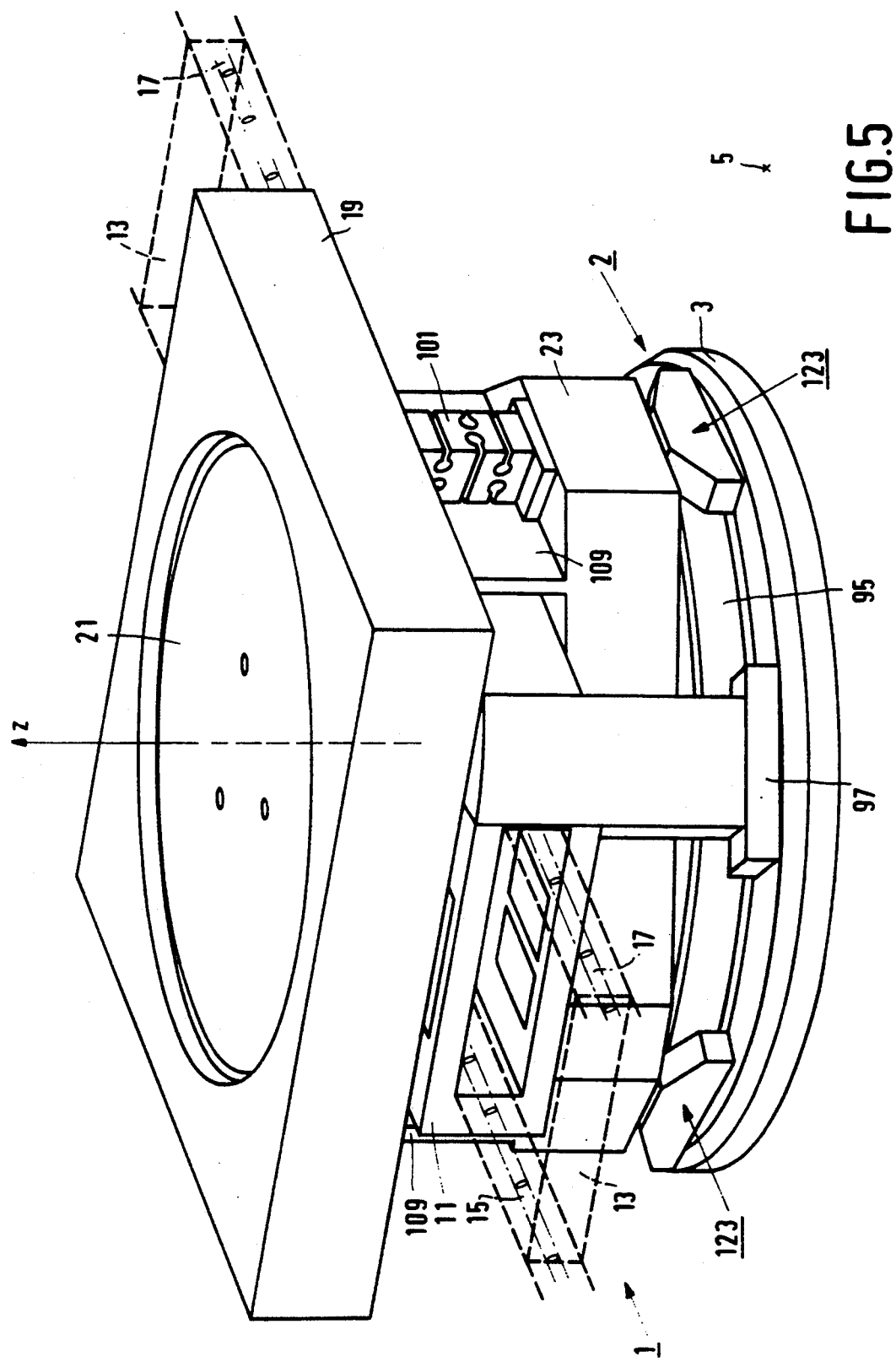
FIG. 5 shows a second embodiment of a support device according to the invention, FIG. 6 diagrammatically shows a few components of the support device of FIG. 5.

As is further shown in FIG. 3, the second bearing block 63 is provided with an upright wall 65 which is coupled to the first bearing block 51 by two connecting plates 67 and 69 which extend parallel to the base surface 5. The connecting plates 67 and 69 are each provided near their two ends with a circular cylinder reduced portion 71 which extends parallel to the centerlines 49 and 61. Through the use of the reduced portions 71, the first bearing block 51, the upright wall 65 of the second bearing block 63, and the two connecting plates 67 and 69 form a parallelogram mechanism, whereby the first bearing block 51 is displaceable relative to the second bearing block 63 parallel to the z-direction under elastic deformation of the reduced portions 71. Furthermore, the first bearing block 51 is provided with a crossbeam 73 which extends parallel to the connecting plates 67 and 69. As FIG. 4 shows, the crossbeam 73 and the connecting plate 67 are provided with coaxial drilled holes 75 which extend transverse to the connecting plate 67. The drilled holes 75 surround with little clearance a setscrew 77 which is rotatably provided in a threaded hole 78 in the second bearing block 73, as is shown in FIG. 5. A mechanical helical spring 83 is pretensioned between a head 79 of the setscrew 77 and an upper surface 81 of the crossbeam 73, which spring causes a compression force between the cam-shaped disc 43 and the cam follower 53. The value of the compressions force is modified by rotation of the setscrew 77. A frictional transmission between the cam-shaped disc 43 and the cam follower 53 with an adjustable friction force is obtained in this way.

If the cam follower 53 is rotated by the electric motor 57, the cam-shaped disc 43 is also rotated, so that the first bearing block 51 is displaced relative to the second bearing block 63 parallel to the z-direction. In this way the corner 29 of the rigidification member 23 coupled to the relevant force actuator 37 is displaced relative to the first bearing unit 2 parallel to the z-direction. Since both the diameter of the cam follower 53 (4 mm) and the value Δ4 (1 mm) are small compared with the average diameter of the cam-shaped disc 43 (30 mm), the force actuator 37 has a comparatively small transmission ratio of approximately 0.5 μm displacement parallel to the z-direction per degree of angle of rotation of the cam follower 53. Owing to this small transmission ratio, a reduction mechanism between the electric motor 57 and the cam follower 53 is unnecessary, so that the force actuator 37 is particularly compact and simple as regards its construction. The use of the cam-shaped disc 43 with the driven cam follower 53 provides a particularly accurate force actuator 37 with low hysteresis.

As is shown in FIGS. 2 and 3, each force actuator 37 is coupled to the rigidification member 23 by means of an elastic rod 85 which extends parallel to the z-direction. The elastic rods 85 are each formed by a column 87 extending parallel to the z-direction and by a coupling block 89 on which the relevant corner 29 of the rigidification member 23 is fastened. As FIG. 3 shows, the column 87 is provided near each of its two ends with two mutually perpendicular reduced portions 91, 93 which extend parallel to the base surface 5. The use of the reduced portions 91, 93, which each form an elastic hinge with a hinge axis directed parallel to the base surface 5, achieves that exclusively a support force directed parallel to the z-direction and a torque determined by the support force about an axis of rotation parallel to the base surface 5 are transmitted from the first bearing unit 2 to the rigidification member 23 through the elastic rods 85. The coupling of the rigidification member 23 to the first bearing unit 2 has a high rigidity in a direction parallel to the z-direction, so that the object table 19 is accurately guided along the base surface 5.

It is noted that the use of the elastic rods 85, which are particularly rigid in a direction parallel to the z-direction and which are comparatively flexible transverse to the z-direction, and of the elastically deformable coupling members 35, which are particularly rigid in a direction transverse to the z-direction and comparatively flexible parallel to the z-direction, provides a statically determined coupling of the rigidification member 23 to the first bearing unit 2 and the second bearing unit 11.

Figure 6:
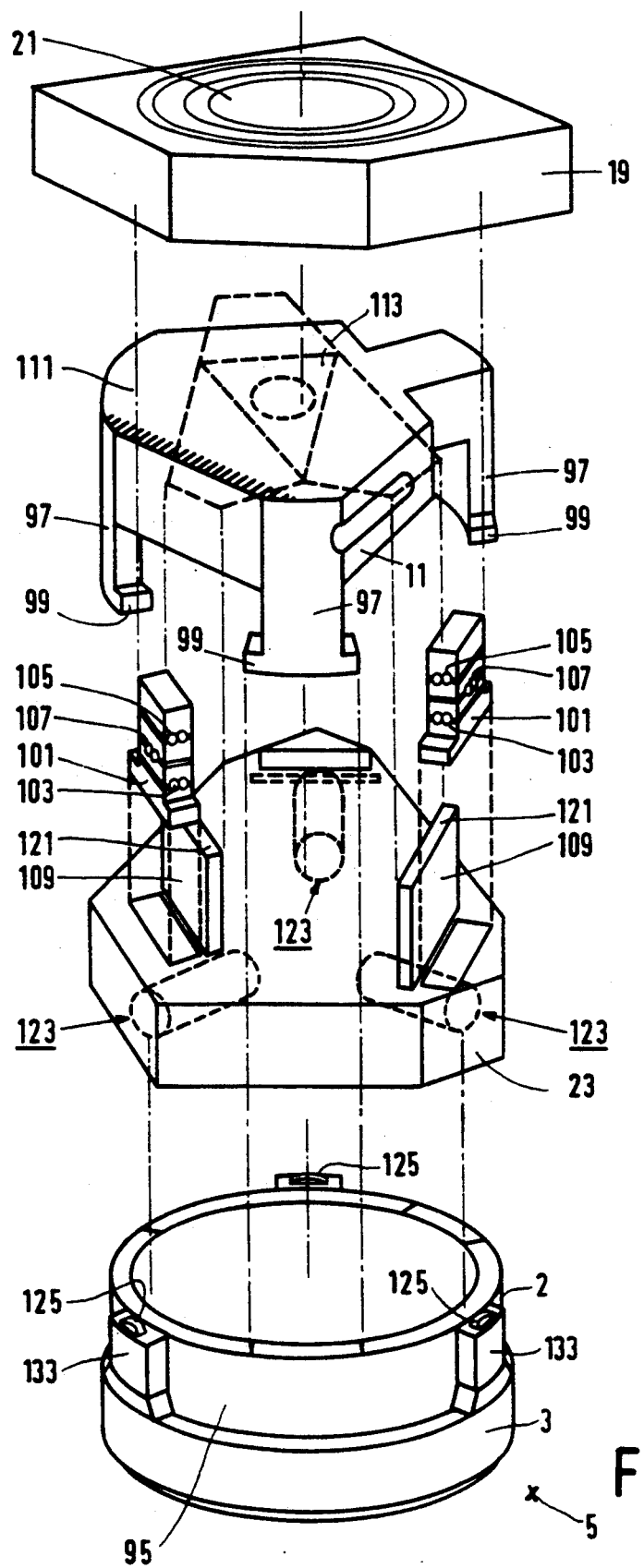

In FIGS. 5 to 8, in which the second embodiment of the support device 1 according to the invention is shown, components of the relevant support device 1 corresponding to those in the first embodiment described above are given the same reference numerals. As FIGS. 5 and 6 show, the support device 1 in its second embodiment is also provided with a first bearing unit 2 having a round aerostatic foot 3 for contactless guiding of the support device 1 along a base surface 5 which extends perpendicular to a z-direction indicated in the relevant Figures. The first bearing unit 2, seen in the z-direction, is shorter in height than the first bearing unit 2 shown in the FIGS. 1 and 2 and is provided along a circumference of the aerostatic foot 3 with a rim 95 which is relatively shorter in height compared with the height of the upright wall 7 in the z direction shown in FIGS. 1 and 2. The support device 1 shown in FIGS. 5 and 6 is further provided with a second bearing unit 11 by which the support device 1 is guided along a straight guide 13 which extends parallel to the base surface 5 and is depicted only diagrammatically in FIG. 5. The straight guide 13 is of a similar kind to that of the straight guide 13 shown in FIGS. 1 and 2 and is provided with parallel round bars 15 and 17 along which the second bearing unit 11 is guided by roller members which are not visible in FIGS. 5 and 6. The second bearing unit 11 is provided with three connecting legs 97 which extend parallel to the z-direction, are mutually positioned in a triangle, and have feet 99 (FIG. 6) which are fastened to the rim 95 of the first bearing unit 2. Only one connecting leg 97 is visible in FIG. 5, while FIG. 6 shows all connecting legs 97.

The second embodiment of the support device 1 is also provided with an object table 19 with a support surface 21 extending transverse to the z-direction on which an object can be positioned. The object table 19 is coupled by means of three support columns 101 to a rigidification member 23 which, in the z-direction, is positioned between the first bearing unit 2 and the second bearing unit 11. Only one support column 101 is visible in FIG. 5, while FIG. 6 shows only two of the three support columns 101 which are mutually positioned in a triangle. The support columns 101 extend along the second bearing unit 11 parallel to the z-direction and are each provided with a first reduced portion 103 (see FIG. 6) directed parallel to the base surface 5 near an end fastened to the rigidification member 23. Near their ends fastened to the object table 19, the support columns 101 are each provided with a second reduced portion 105 which extends parallel to the corresponding first reduced portion 103. As is further shown in FIG. 6, the support columns 101 are each provided with a third reduced portion 107, which extends transverse to the first reduced portion 103 and the second reduced portion 105, between the first reduced portion 103 and the second reduced portion 105. The use of the support columns 101 with the reduced portions 103, 105 and 107, which each form an elastic hinge, provides a particularly rigid and statically determined coupling of the object table 19 to the rigidification member 23. The use of the support columns 101 here prevents deformations of the object table 19 which can arise in practice as a result of, for example, differences in thermal expansion between the object table 19 and the rigidification member 23. Such differences in expansion are accommodated by elastic deformation of the reduced portions 103, 105 and 107, while a rigid coupling of the object table 19 to the rigidification member 23 is maintained. It will become apparent below that this statically determined coupling of the object table 19 to the rigidification member 23 is of particular advantage in the application of the support device 1 in an optical lithographic device.

Figure 7:
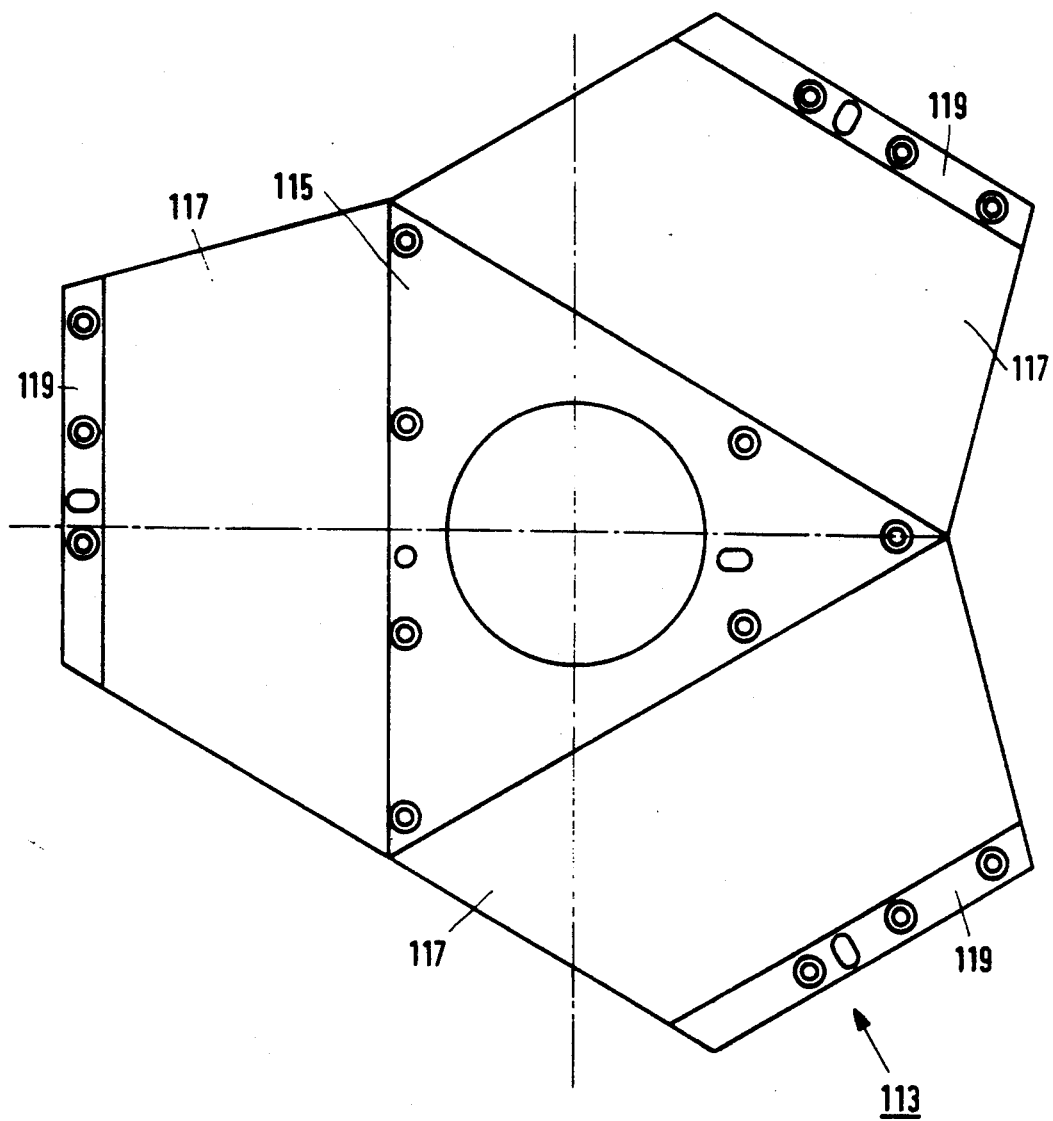
FIG. 7 shows an elastically deformable coupling member of the support device of FIG. 5.

As is shown in FIGS. 5 and 6, three coupling plates 109 extending transverse to the base surface 5 and arranged in spaced relation on the sides of a triangle are provided on the rigidification member 23. Only two coupling plates 109 are partly visible in FIG. 5, whereas two coupling plates 109 are fully visible in FIG. 6. Each of the coupling plates 109 is positioned parallel to one of the support columns 101 and extends alongside the second bearing unit 11 in the assembly depicted in FIG. 5, as does the accompanying support column 101. A plate-shaped coupling member 113, shown in FIG. 7, extending transverse to the z-direction is fastened on an upper surface 111, shown in FIG. 6, of the second bearing unit 11. The coupling member 113 is not visible in FIG. 5, while the coupling member 113 is depicted in FIG. 6 diagrammatically only in dashed lines. As is shown in FIG. 7, the coupling member 113 is provided with a triangular central plate 115 which is screwed down on the upper surface 111 of the second bearing unit 11. The coupling member 113 is further provided with three side plates 117 which are each screwed down near their ends 119 on an upper surface 121, shown in FIG. 6, of one of the coupling plates 109 of the support member 23. The side plates 117 of the coupling member 113 each form a leaf spring which extends transverse to the z-direction and is flexible parallel to the z-direction. A positioning force directed parallel to the base surface 5 and exerted on the support device 1 by the straight guide 13, and a torque determined by this positioning force about an axis of rotation directed parallel to the z-direction are transmitted from the second bearing unit 11 to the rigidification member 23 via the side plates 117 and the coupling plates 109. Owing to the triangular arrangement of the coupling plates 109, a particularly rigid coupling of the coupling member 113 to the rigidification member 23 is then provided transverse to the z-direction.

The rigidification member 23 is furthermore coupled to the first bearing unit 2 by means of three force actuators 123. The force actuators 123, which are positioned in a triangular arrangement relative to one another and are depicted diagrammatically in FIGS. 5 and 6, are each positioned below one of the support columns 101. One of the force actuators 123 is shown in detail in FIG. 8.

Figure 8:
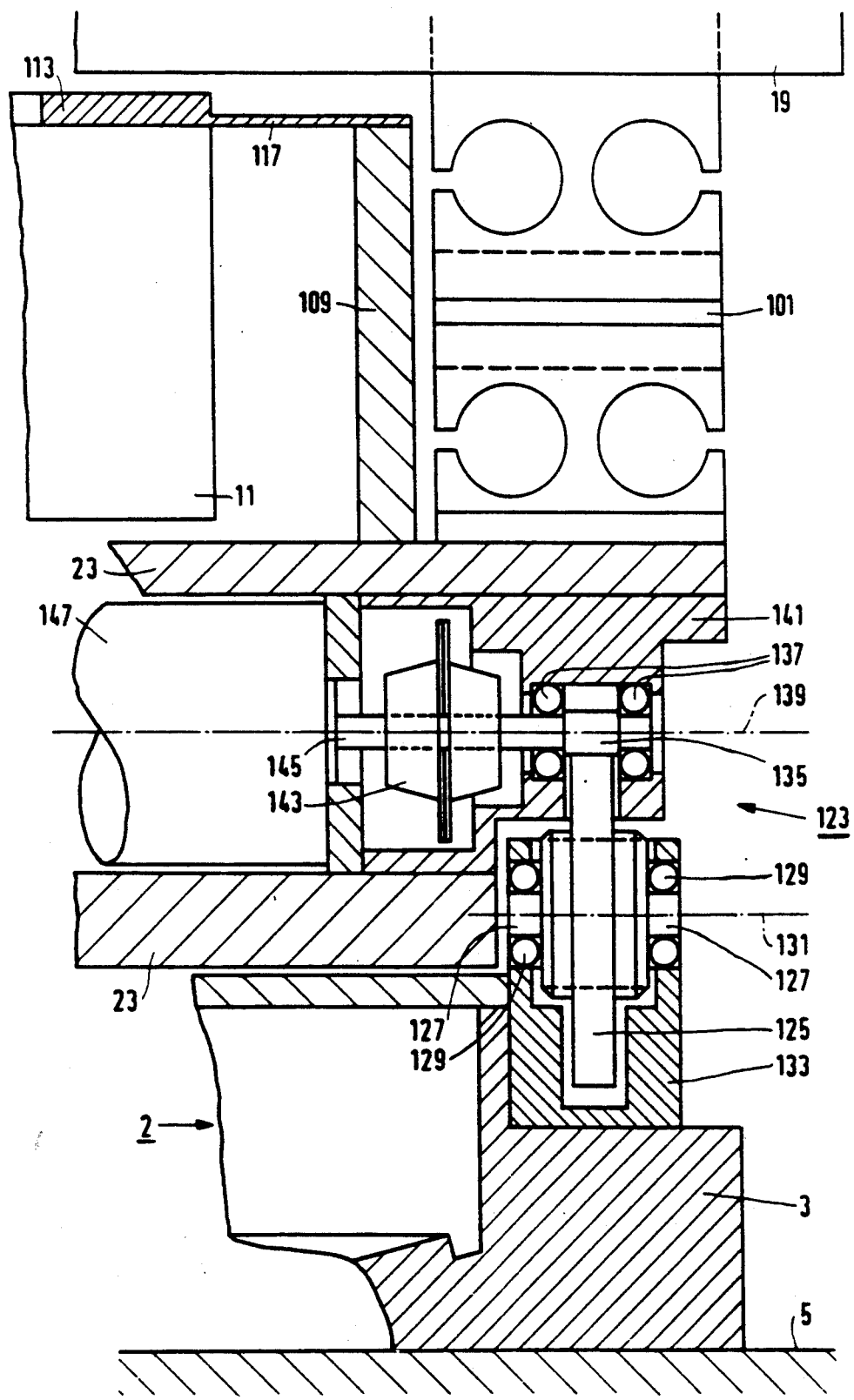
FIG. 8 shows in cross-section a force actuator forming part of a force actuator system of the support device of FIG. 5.

As FIG. 8 shows, the force actuator 123 is provided with a metal cam-shaped disc 125 with two journals 127. The journals 127 are rotatably supported in two ball bearings 129 which have a common centerline 131 directed parallel to the base surface 5 and are provided in a U-shaped bearing block 133 of the first bearing unit 2. The force actuator 123 is further provided with a round metal cam follower 135 which rests on the cam-shaped disc 125 and is supported in two ball bearing 137. The ball bearings 137, which have a common centerline 139 directed parallel to the base surface 5, are provided in a U-shaped bearing block 141 which is fastened to the rigidification member 23. As is further shown in FIG. 8, the cam follower 135 is coupled to an output shaft 145 of an electric motor 147, which is fastened to the rigidification member 23, via a coupling member 143.

The cam-shaped disc 125 and the cam follower 135 have shapes identical to those of the cam-shaped disc 43 and cam follower 53 of the first embodiment of the support device depicted in FIG. 4. When the cam follower 135 is rotated by the electric motor 147, the cam-shaped disc 125 is also rotated, so that the support column 101 of the object table 19 positioned near the relevant force actuator 123 is displaced substantially parallel to the z-direction. If the electric motors 147 of the three force actuators 123 are rotated through equal angles, the rigidification member 23 with the object table 19 is displaced parallel tot he z-direction, while the three side plates 117 of the coupling member 113 are bent. The use of the plate-shaped coupling member 113 renders displacements of the object table 19 of approximately 1 mm parallel to the z-direction possible, as is the case with the first embodiment of the support device 1. If the electric motors 147 are given different angular rotations, a rotation of the object table 19 about an axis of rotation directed parallel to the base surface 5 is obtained. A pretensioned mechanical spring, not shown in the Figures, is positioned near each of the force actuators 123. A compression force is provided between the cam-shaped disc 125 and the cam follower 135 by mechanical spring, whose first end is fastened to the first bearing unit 2 and whose second end is fastened to the rigidification member 23, so that a low-hysteresis drive of the cam-shaped disc 125 is achieved.

As noted above an in FIG. 8, the cam follower 135 rests on the cam-shaped disc 125. Thus a supporting force directed transverse to the base surface 5 and a torque about an axis of rotation directed parallel to the base surface 5 determined by this supporting force are exclusively transmitted from the first bearing unit 2 to the rigidification member 23 via the force actuators 123. Through the use of the coupling member 113, which is particularly rigid in a direction transverse to the z-direction and comparatively flexible in a direction parallel to the z-direction, in combination with the force actuators 123, a direct, rigid, and thus accurately determined transmission of the forces exerted on the support device 1 by the base surface 5 and the straight guide 13 is obtained in the second embodiment of the support device 1. Since the second bearing unit 11 is positioned between the object table 19 and the rigidification member 23, it is additionally achieved that the center of gravity of the unit formed by the object table 19 and the rigidification member 23 is situated substantially at the level of the straight guide 13 in the z-direction. The positioning force exerted on the support device 1 by the straight guide 13 is thus applied to the unit near its center of gravity, so that a particularly stable guiding of the object table 19 along the straight guide 13 is provided.

Figure 9:
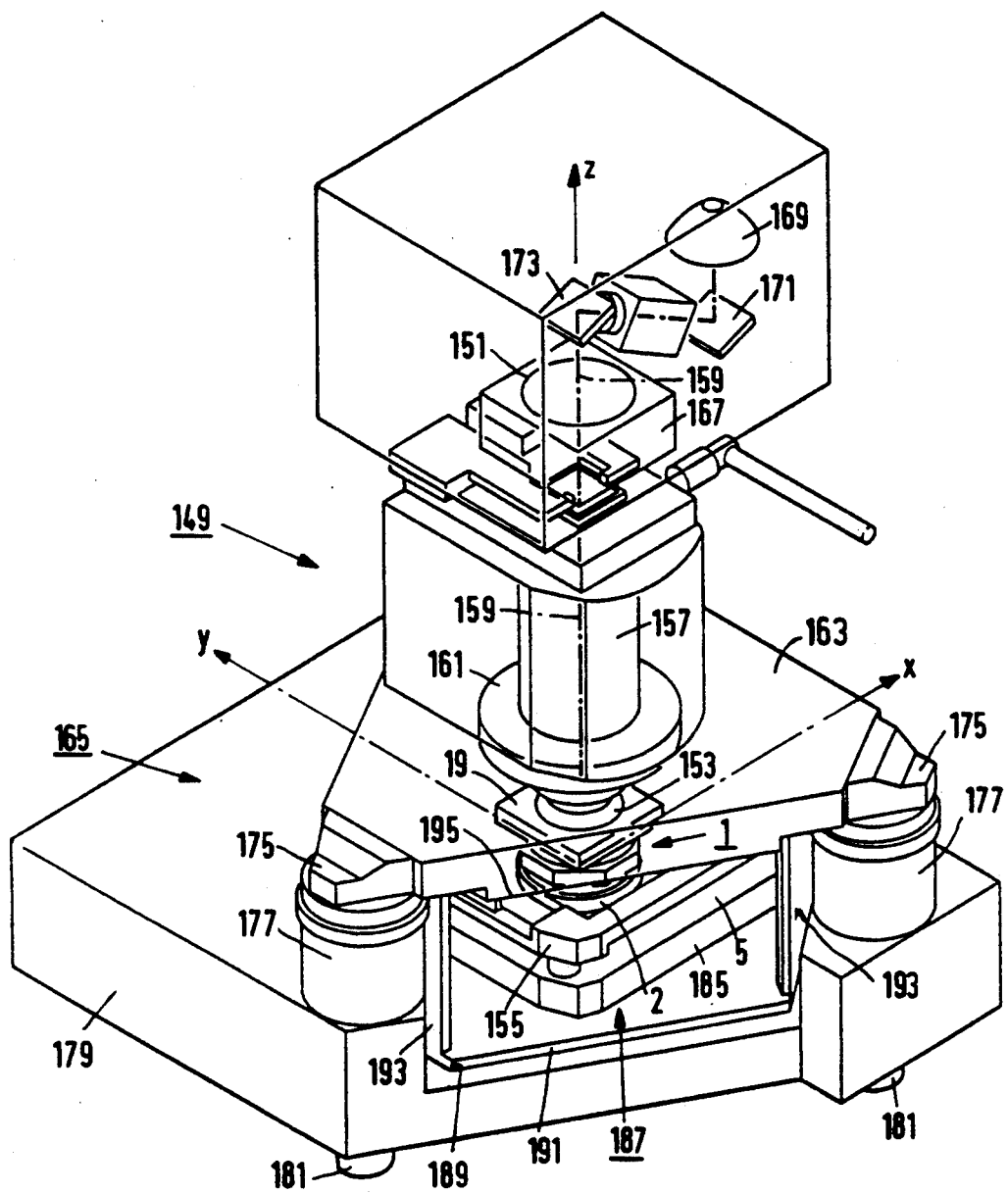
FIG. 9 shows an optical lithographic device provided with a support device according to the invention.
Figure 10:
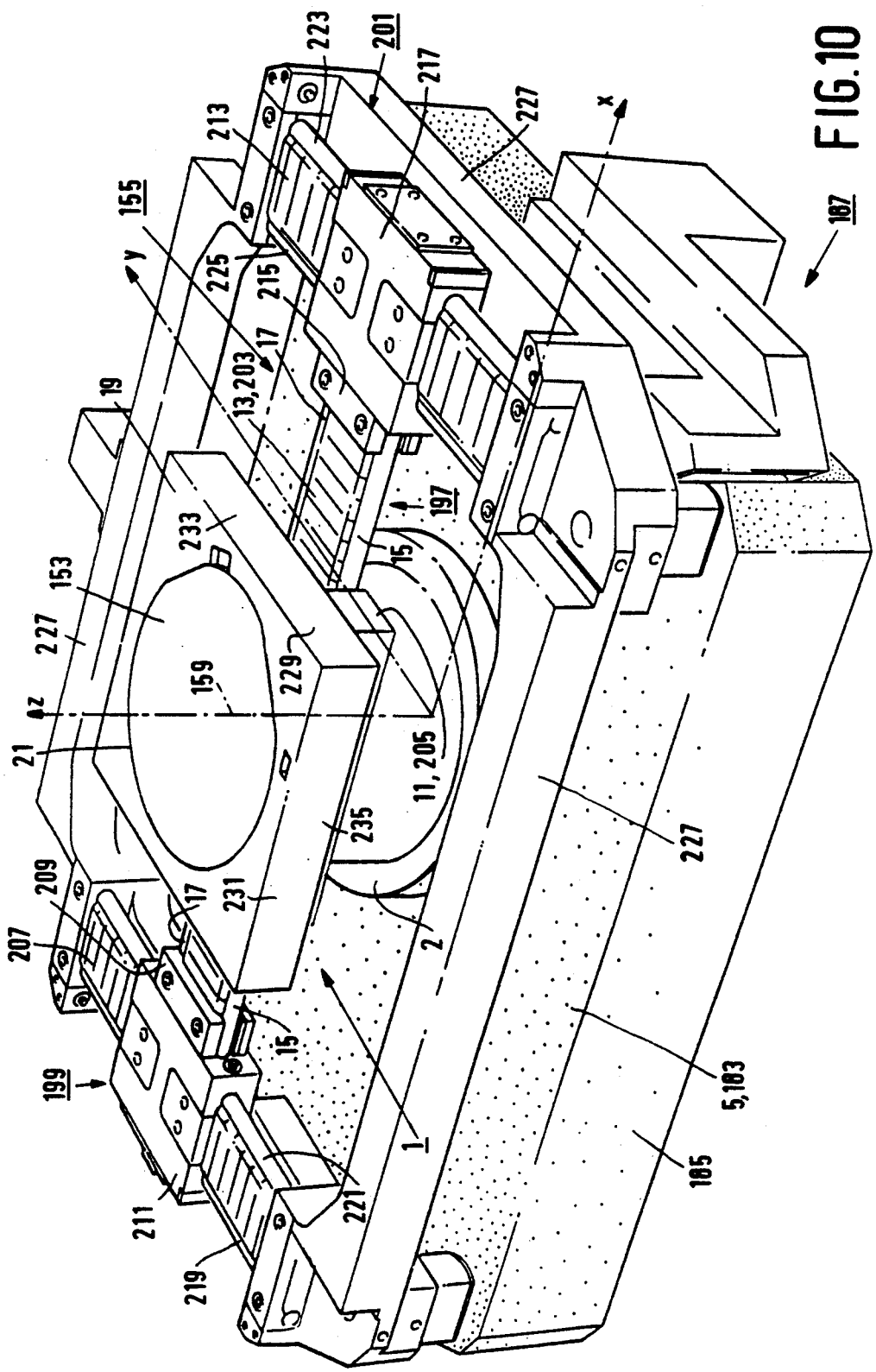
FIG. 10 shows a unit formed by the support device and a support member of the optical lithographic device of FIG. 9.

The support device 1 according to the invention described above with reference to two embodiments is particularly suitable for use in an optical lithographic device 149 according to the invention as shown in the FIGS. 9 and 10 due to its rigid, play-free and low-hysteresis construction. The device 149 is used in the manufacture of integrated semiconductor circuits which have structures with detail dimensions of the order of tenths of micrometers. The device 149 forms an optical projection system by which a pattern of an electronic semiconductor circuit provided on a mask 151 is repeatedly imaged on a reduced scale on a large number of locations of a semiconductor substrate 153 which correspond to identical integrated circuits. The semiconductor substrate 153 placed on the object table 19 of the support device 1 is for this purpose displaced step by step by a drive unit 155 coupled to the support device 1 relative to an optical lens system 157 parallel to an x-direction and to a y-direction perpendicular to the x-direction, both of which directions are perpendicular to an optical main axis 159 of the lens system 157, which is parallel to a z-direction.

The construction of the optical lithographic device 149 is briefly described below. As is shown in FIG. 9, the lens system 157 is fastened by means of a mounting ring 161 near a lower side to a mounting member 163 which forms part of a frame 165 of the device 149 and is constructed as a substantially triangular plate which extends in a plane perpendicular to the optical main axis 159. Near an upper side of the lens system 157, the device 149 is provided with a mask manipulator 167 for positioning and supporting the mask 151 relative to the lens system 157. During operation, a light beam coming from a light source 169 is conducted through the mask 151 via mirorrs 171 and 173 and focused on the semiconductor substrate 153 positioned on the support device 1 by the lens system 157. The mounting member 163 is provided with three corner parts 175 which each rest on a lower frame support 177. Only two corner parts 175 and two lower frame supports 177 are visible in FIG. 9. The lower frame supports 177 are here positioned on a box-shaped base 179 of the frame 165 which is positioned on a flat foundation by adjustment members 181. The device 149 is spring-mounted with low frequency relative to the foundation by the lower frame supports 177 in order to prevent undesirable vibrations being transmitted from the foundation through the lower frame supports 177 to the lens system 157 and the support device 1.

As FIGS. 9 and 10 show, the base surface 5 over which the support device 1 is guided by the first bearing unit 2 is formed by an upper surface 183 of a support member 185 in the form of a granite slab, which upper surface extends perpendicular to the optical main axis 159. The support member 185 together with the support device 1 and the drive unit 155 forms a unit 187 which is provided on a carrier 189 of the frame 165. The carrier 189 is formed by a substantially triangular plate which extends perpendicular to the optical main axis 159 and which has main edges 191 which extend each between two lower frame supports 177. Furthermore, the carrier 189 is suspended from a lower side 195 of the mounting member 163, indicated in FIG. 9, by three plate-shaped suspension elements 193. The suspension elements 193, of which only two are partly visible in FIG. 3, are each formed by a plate which extends in a vertical plane parallel to the optical main axis 159, the vertical planes enclosing angles of substantially 60° with one another.

FIG. 10 shows the unit 187 referred to above in detail. As the Figure shows, the drive unit 155 coupled tot he support device 1 is provided with three linear electric motors 197, 199 and 201. The linear motor 197 comprises an x-stator 203 extending parallel to the x-direction with which the straight guide 13 with the rods 15 and 17 extending parallel to the x-direction is integrated. The linear motor 197 further comprises an x-translator 205 with permanent magnets which are integrated with the second bearing unit 11 of the support device 1. The linear motors 199 and 201 comprise a y-stator 207 extending parallel to the y-direction with a y-translator 211 equipped with permanent magnets and fastened to a first end 209 of the x-stator 203, and a y-stator 213 extending parallel to the y-direction with a y-translator 217 equipped with permanent magnets and fastened to a second end 215 of the x-stator 203, respectively. Guide rods 219 and 221 parallel to the y-direction and guide rods 223 and 225 parallel to the y-direction are fastened to the y-stators 207 and 213, respectively. The y-translators 211 and 217 are provided with roller members, not visible in FIG. 10, for guiding the y-translators 211 and 217 along the guide rods 219, 221 and the guide rods 223, 225, respectively. Furthermore, the y-stators 207 and 213 are fastened to a window frame 227 of the drive unit 155 which near its corners is fastened to the upper surface 183 of the support member 185. The object table 19 of the support device 1 is displaceable parallel to the x-direction by the linear motor 197, while the object table 19 is displaceable parallel to the y-direction and rotatable through a limited angle about an axis of rotation parallel to the optical main axis 159 by the linear motors 199 and 201. By rotating the object table 19 in this way, the undesirable rotation of the object table 19 referred to above about an axis of rotation parallel to the z-direction may be compensated for, which undesirable rotation arises in the first embodiment of the support device 1 upon a displacement of the object table 19 parallel to the z-direction.

The semiconductor substrate 153 is focused relative to the lens system 157 through a displacement parallel to the z-direction of the object table 19 by the force actuators 37 (first embodiment) or the force actuators 123 (second embodiment). In practice, the semiconductor substrate 153 has a non-uniform thickness owing to manufacturing tolerances, so that an optimum focusing of the entire semiconductor substrate 153 without further measures in not possible. By tilting the semiconductor substrate 153 also through a limited angle about an axis of rotation directed parallel to the base surface 5 by the force actuators 37, 123, an optimum focusing is obtained in the case of a non-uniform thickness of the semiconductor substrate 153.

The position of the object table 19 in the x-direction and in the y-direction is measured in the device 149 by a laser interferomter system of a kind known per se which is not shown in FIGS. 9 and 10 for simplicity's sake. Mirrors 233 and 235 belonging to the laser interferometer system are provided on a first side face 229 of the object table 19, extending perpendicular to the x-direction and shown in FIG. 10, and on a second side face 231, extending perpendicular to the y-direction, respectively. During operation, the object table 19 remains free from deformations which can arise as a result of, for example, thermal expansion and elastic deformation of the first and the second bearing unit 2, 11, due to the stress-free support of the object table 19 on the rigidification member 23 by the support balls 31 (first embodiment of the support device 1) or the statically determined coupling of the object table 19 to the rigidification member 23 by the support columns 101 (second embodiment of the support device 1). An accurately determined position of the two mirrors 233, 235 relative to the support surface 21 of the object table 19 is thus achieved, so that a particularly accurate position determination of the semiconductor substrate 153 is possible by the laser interferometer system.

It is noted that the first bearing unit 2, which is provided with a static gas bearing in both embodiments of the support device 1 described above, may also be designed in an alternative way. Thus, the first bearing unit 2 may be provided with, for example, a pre-tensioned electromagnetic bearing, the base surface 5 being made of a magnetic material. The second bearing unit 11 may also be provided with, for example, an electromagnetic bearing, electromagnets being positioned on either side of a straight guide made of a magnetic material and extending parallel to the base surface 5.

It is further noted that a tilting of the object table 19 about any desired axis of rotation parallel to the base surface 5 can be achieved by the use of the three force actuators 37, 123. Such a tilting may also be obtained by alternative force actuator systems, such as, for example, a force actuator system comprising a $\phi$-actuator which renders possible a tilting about an x-axis direction parallel to the base surface 5, and a $\psi$-actuator associated with the $\phi$-actuator, which renders possible a tilting about a y-axis which is parallel to the base surface 5 and transverse to the x-axis. With the use of such a force actuator system, however, it is more difficult to realize a statically determined coupling of the rigidification member 23 to the first and the second bearing unit 2, 11.

It is furthermore noted that the force actuators 37, 123 each exert a force on the rigidification member 23 which is directed substantially parallel to the z-direction. Instead of the force actuators 37, 123 with the cam-shaped discs 43, 125 and the respective cam-followers 53, 135, alternative force actuators may be used, such as, for example, force actuators provided with a linear motor acting in the z-direction (for example, a moving-coil motor), or a linear motor in combination with a piezo actuator. Such alternative force actuators, however, generally have a more intricate construction.

It is also noted that the support device according to the invention is in general applicable to frictionless, play-free and low hysteresis displacements of materials and objects which are to be investigated and/or processed. In may such cases, accurate displacements are required in the z-direction, or accurate tilting movements about an axis of rotation directed parallel to the base surface 5.

It is further noted that the linear motors 197, 199 and 201 mutually positioned in an H-shape are know per se from U.S. Pat. No. 4,737,823. When used in an optical lithographic device, the support device may also be combined with an alternative drive unit, such as, for example, a two-stage drive unit known from the Netherlands Patent Application No. 89024371. In this two-stage drive unit, the object table is guided by a carriage which is displaceable relative to the base surface in two coordinate directions. The object table in that case is drive relative to the carriage in the same coordinate directions exclusively by Lorentz forces.

It has already been noted above that the optical lithographic device described there is eminently suitable for illuminating semiconductor substrates in the manufacture of integrated electronic circuits. It is finally noted that such a lithographic device can also be used for the manufacture of other products which are provided with structures with detail dimensions of the order of tenths of micrometers, where mask patterns are to be imaged on a substrate by means of the device. Examples are structures of integrated optical systems, conduction and detection patterns of magnetic domain memories, and structures of liquid crystal image display patterns.

We claim:

1. A support device for supporting an object relative to a base surface comprising: a force actuator system; a first bearing unit; a second bearing unit supported by the first bearing unit; said first bearing unit for guiding the support device along said base surface; a straight guide extending parallel to the base surface and coupled to the second bearing unit; a support unit including an object table coupled to a rigidification member, said support unit being displaceable relative to the first bearing unit parallel to a z-direction perpendicular to the base surface by said force actuator system; said support unit being rotatable relative to the first and the second bearing units about at least one axis of rotation extending parallel to the base surface by said force actuator system; and a coupling member for coupling the rigidification member to the second bearing unit, said coupling member being elastically deformable in a direction parallel to the z-direction.

2. A support device as claimed in claim 1, wherein the force actuator system comprises three force actuators, each of the force actuators during operation exerting a force on the rigidification member which force is substantially parallel to the z-direction.

3. The device of claim 2 including successively coupled to said support unit:
   a lens system with an optical main axis extending parallel to the z direction;
   a mask manipulator; and
   a light source including a shutter for repetitive illumination of a substrate object supported by said support unit, said object table comprising a support surface for the object, said support surface being substantially perpendicular to the optical main axis.

4. A support device as claimed in claim 2 wherein each of the force actuators comprises a cam and a driven cam follower, the cam being fastened to a rotatable camshaft extending parallel to the base surface and a drive motor having an output shaft, the cam follower being coupled to the output shaft of the drive motor, said shaft being parallel to the camshaft.

5. The device of claim 4 including successively coupled to said support unit:
   a lens system with an optical main axis extending parallel to the z direction;
   a mask manipulator; and
   a light source including a shutter for repetitive illumination of a substrate object support by said support unit, said object table comprising a support surface for the object, said support surface being substantially perpendicular to the optical main axis.

6. A support device as claimed in claim 4 wherein the rigidification member, in the z-direction, is positioned between the first and the second bearing units, the object table being fastened to the rigidification member by elastic support columns which extend alongside the second bearing unit parallel to the z-direction, the second bearing unit being fastened to the first bearing unit by fastening members which extend alongside the rigidification member parallel to the z-direction.

7. A support device as claimed in claim 6 wherein the rigidification member is coupled to the second bearing unit by three leaf springs extending transverse to the z-direction.

8. A support device as claimed in claim 6, wherein the object table is fastened to the rigidification member by three elastic support columns which are each provided at a first and a second end with a first reduced portion extending parallel to the base surface and a second reduced portion extending parallel to the first reduced portion, respectively, and which are each provided between the first and the second reduced portions with a third reduced portion extending transverse to the first and the second reduced portions.

9. A support device as claimed in claim 8 wherein the drive motor is fastened to the rigidification member, said camshaft being fastened to the first bearing unit.

10. A support device as claimed in claim 4, wherein the drive motor is fastened to the first bearing unit and the camshaft is coupled to the rigidification member.

11. A support device as claimed in claim 10 including a plurality of said coupling members wherein the rigidification member comprises three support elements for supporting the object table, said elements being situated in a triangle relative to one another in a plane transverse to the z-direction, the support elements each being connected to a corresponding different plate-shaped strip, each of the strips being coupled to the second bearing unit by a different one of said coupling members each of which extends in said plane.

12. The device of claim 11 including successively coupled to said support unit:
a lens system with an optical main axis extending parallel to the z direction;
a mask manipulator; and
a light source including a shutter for repetitive illumination of a substrate object supported by said support unit, said object table comprising a support surface for the object, said support surface being substantially perpendicular to the optical main axis.

13. A support device as claimed in claim 11 wherein each of the support elements of the rigidification member comprises a support ball.

14. A support device as claimed in claim 11 wherein each of the support elements of the rigidification member is coupled to one of the force actuators of the force actuator system by an elastic rod which extends in a direction parallel to the z-direction.

15. A support device as claimed in claim 14 wherein each of the elastic rods comprises a column extending parallel to the z-direction and provided near both its ends with two mutually perpendicular reduced portions.

16. A support device as claimed in claim 11 wherein said plate-shaped strips each have opposing ends and which extend transverse to a bisector of a different angle of a triangle which angle is adjacent to the corresponding support element and which strip has a reduced portion near each said ends extending substantially parallel to the adjacent bisector.

17. A support device as claimed in claim 1 wherein the rigidification member, in the z-direction, is positioned between the first and the second bearing units, the object table being fastened to the rigidification member by elastic support columns which extend alongside the second bearing unit parallel to the z-direction, the second bearing unit being fastened to the first bearing unit by fastening members which extend alongside the rigidification member parallel to the z-direction.

18. A support device as claimed in claim 17 wherein the rigidification member is coupled to the second bearing unit by three leaf springs extending transverse to the z-direction.

19. A support device as claimed in claim 17 wherein the object table is fastened to the rigidification member by three elastic support columns which are each provided at a first and a second end with a first reduced portion extending parallel to the base surface and a second reduced portion extending parallel to the first reduced portion, respectively, and which are each provided between the first and the second reduced portions with a third reduced portion extending transverse to the first and the second reduced portions.

20. The device of claim 19 including successively coupled to said support unit:
a lens system with an optical main axis extending parallel to the z direction;
a mask manipulator; and
a light source including a shutter for repetitive illumination of a substrate object supported by said support unit, said object table comprising a support surface for the object, said support surface being substantially perpendicular to the optical main axis.

21. A support device as claimed in claim 19 wherein the drive motor is fastened to the rigidification member, said camshaft being fastened to the first bearing unit.

22. The device of claim 17 including successively coupled to said support unit:
a lens system with an optical main axis extending parallel to the z direction;
a mask manipulator; and
a light source including a shutter for repetitive illumination of a substrate object supported by said support unit, said object table comprising a support surface for the object, said support surface being substantially perpendicular to the optical main axis.

23. The device of claim 1 including successively coupled to said support unit:
a lens system with an optical main axis extending parallel to the z direction;
a mask manipulator; and
a light source including a shutter for repetitive illumination of a substrate object supported by said support unit, said object table comprising a support surface for the object, said support surface being substantially perpendicular to the optical main axis.

24. A device for supporting an object relative to a base surface comprising:
force actuator means;
first bearing means for guiding the device relative to said base surface;
second bearing means supported by the first bearing means and including means for guiding the second bearing means in a direction parallel to said base surface;
object support means including a rigidification member coupled to the second bearing means and including an object support table coupled to the rigidification member, said force actuator means for displacing the support means relative to the first bearing means parallel to a z direction perpendicular to said base surface and for rotating the support means relative to the first and second bearing means about at least one axis of rotation extending parallel to the base surface; and coupling means elastically deformable in a direction parallel to the z direction for elastically coupling the rigidification member to the second bearing means in the z direction.

25. The device of claim 24 further including successively coupled to said support means:
optical means having an optical axis extending parallel to the z direction;
mask manipulator means for manipulating a mask relative to the support means; and
means for repetitive illumination of a substrate object supported by said support unit, said object table having a support surface for the object, said support surface being substantially perpendicular to the optical main axis.

26. An object manipulation device for manipulating an object relative to a base comprising:
first bearing means adapted to be movable secured to said base;
second bearing means secured to the first bearing means;
an object support comprising an object support table and a rigidification member coupled to said support table, said second bearing means for supporting the member; and
means for elastically coupling the member for selective displacement in a first direction normal to said base relative to the first bearing means in response to a first force applied to said member in said first direction and for selective rotation relative to the first bearing means about an axis normal to said first direction in response to a second force applied to said member in said first direction.

27. The device of claim 26 wherein said means for coupling includes a plurality of elastic coupling members secured in spaced relation to said rigidification member and to one of said bearing means, said coupling members each elastically deforming in response to an applied force in said first direction and being relatively rigid in a direction normal to said first direction, said means for applying said first force comprising means for applying a force in said first direction to said rigidification member adjacent to each said coupling members to cause said rigidification member to linearly displace in said first direction and means for applying said second force comprising means for applying a force in said first direction to said rigidification member adjacent to at least one of said coupling members to rotate the rigidification member about said axis.

28. The device of claim 27 including three of said coupling members in equal spaced relation at locations defining the apexes of a triangle.

29. The device of claim 28 wherein said force applying means includes three force applying actuators, each corresponding to a different coupling member and secured to one of said bearing means.

30. The device of claim 29 wherein said force actuators each comprise an actuator member for imparting a displacement force to the rigidification member, said actuator member being constructed to provide relatively rigid coupling to said rigidification member in the first direction and elastic coupling in a direction normal to the first direction.

31. The device of claim 30 wherein said force actuators comprise cam means coupled to said actuator member and said first bearing means, said actuator member being between the rigidification member and the cam means.

32. The device of claim 28 wherein said coupling members comprise leaf springs.

33. The device of claim 28 wherein the coupling members comprise elements of reduced cross section for permitting one portion of an element to displace relative to a second portion.

* * * * *